United States Patent [19]
Wharton et al.

[11] Patent Number: 6,040,530
[45] Date of Patent: Mar. 21, 2000

[54] VERSATILE PRINTED CIRCUIT BOARD FOR TESTING PROCESSING RELIABILITY

[75] Inventors: Robert J. Wharton, Rocklin; Eric R. Daniel, Sacramento; Joseph D. Brown, Rocklin, all of Calif.

[73] Assignee: Hewlett-Packard Company, Palo Alto, Calif.

[21] Appl. No.: 08/986,078

[22] Filed: Dec. 5, 1997

[51] Int. Cl.$^7$ .................................................. H01R 9/09
[52] U.S. Cl. ........................... 174/261; 361/777; 439/69; 333/246; 324/409
[58] Field of Search .................................. 174/261, 260, 174/252; 361/777, 749; 324/410, 409, 408, 407, 406, 405, 745; 439/69; 333/246

[56] References Cited

U.S. PATENT DOCUMENTS

| | | | |
|---|---|---|---|
| 3,588,616 | 6/1971 | Palazzini | 361/783 |
| 3,964,087 | 6/1976 | Mallon | 338/306 |
| 4,725,775 | 2/1988 | McMinn | 324/765 |
| 4,926,546 | 5/1990 | Polczynski et al. | 29/840 |
| 5,552,567 | 9/1996 | Peterson et al. | 174/261 |
| 5,642,262 | 6/1997 | Terrill et al. | 361/783 |
| 5,764,491 | 6/1998 | Tran | 361/794 |
| 5,784,264 | 7/1998 | Tanioka | 361/803 |
| 5,824,964 | 10/1998 | Kasai et al. | 174/252 |
| 5,896,037 | 4/1999 | Kudla et al. | 324/755 |

OTHER PUBLICATIONS

TopLine 1996/97 Product Guide, Available from TopLine, 11751 Markon Drive, Garden Grove, CA 92841–1812, pp. 80–87. No month.

IBM Technical Disclosure Bulletin 174–252 Dated Jan. 1969.

*Primary Examiner*—Kristine Kincaid
*Assistant Examiner*—Dhiru R Patel

[57] ABSTRACT

A printed circuit board can be used as a test card. The printed circuit board has a first image and a second image. The first image includes a first array pattern for attaching a package, a first power plane, and a first ground plane. The second image includes a second array pattern for attaching a package, a second power plane, and a second ground plane. A first routing area between the first image and the second image electrically and physically isolates the first power plane from the second power plane. The first routing area also physically isolates the first ground plane from the second ground plane. A first single trace extends through the first routing area. The first single trace electrically connects the first ground plane to the second ground plane.

21 Claims, 7 Drawing Sheets

VERSATILE PRINTED CIRCUIT BOARD FOR TESTING PROCESSING RELIABILITY

BACKGROUND

The present invention concerns testing the reliability of processes performed in constructing a printed circuit board.

Printed circuit boards are often processed using automated processing equipment. When setting up such automated processing equipment it is generally necessary to test the automated processes before using the equipment to produce printed circuit boards to be distributed commercially.

The testing generally includes checking the integrity of the soldering process. This includes assuring that when soldering parts to the printed circuit board connections are strong and reliable and that parts are not damaged during the soldering processing. Additionally, it is necessary to verify that, after cleaning is completed, the soldering joints are clean and there is no remaining contaminants which can cause shorts. Also there is a need to test the reliability of the solder joints under environmental stress conditions. If the automated test equipment is to be used with printed circuit boards of different sizes and shapes, it is necessary to perform testing on printed circuit boards which are of similar size and shape as production printed circuit boards.

In order to test automated processing equipment, test cards are often used. Existing test cards are typically fabricated with hot air solder leveling. These test cards include daisy-chain patterns. The daisy chain patterns allow for continuity testing of soldered packages. In order to perform such testing, integrated circuit packages, which are specially designed for testing automated processing equipment, are soldered to the test cards. After the assembly process is finished, an ohmmeter is used to determine whether the electrical connections are complete.

While existing test cards are useful in testing automated processing equipment, the currently available cards are limited in the available size of cards, are limited in package selection and are limited in the types and versatility of testing that may be performed.

SUMMARY OF THE INVENTION

In accordance with the preferred embodiment of the present invention, a printed circuit board can be used as a test card. The printed circuit board has a first image and a second image. The first image includes a first array pattern for attaching a package, a first power plane, and a first ground plane. The second image includes a second array pattern for attaching a package, a second power plane, and a second ground plane. A first routing area between the first image and the second image electrically and physically isolates the first power plane from the second power plane. The first routing area also physically isolates the first ground plane from the second ground plane. A first single trace extends through the first routing area. The first single trace electrically connects the first ground plane to the second ground plane.

In a preferred embodiment of the present invention, the printed circuit board has a first image. In the first image there is a first ball grid array pattern for attaching a first input/output ball grid array package. The first ball grid array pattern includes a de-populated center area. A first surface insulation resistance pattern is laid out within the de-populated center area of the first ball grid array pattern.

As part of the same embodiment of the present invention, or as part of an alternative embodiment, a second ball grid array pattern is within the first image. The second ball grid array pattern is for attaching a second input/output ball grid array package. The second ball grid array pattern has rows of interconnect pads. A second surface insulation resistance pattern is laid out between the rows of interconnect pads. For example, the second surface insulation resistance pattern is laid out at a 45 degree angle with respect to the rows of interconnect pads.

Also in the preferred embodiment, the first image includes a third ball grid array pattern for attaching a third input/output ball grid array package, and includes a fourth ball grid array pattern for attaching a fourth input/output ball grid array package. The first image also includes a through hole connector area for receiving leads of a through hole connector, and a plurality of wagon wheel face plate connectors. This allows for a variety of types of testing using the same printed circuit board.

Within the first image, a plurality of pairs of surface mount pads are for mounting LEDs. Also, a plurality of interconnect vias are for connecting terminals of a tester during environmental testing.

The printed circuit board can include additional images. For example, the printed circuit board includes a second image which is substantially identical to the first image, and includes a third image which substantially identical to the first image and the second image.

The present invention has significant advantages over prior art test boards. For example, connection of ground planes with a single trace allows testing using a common ground while images remained attached together. The surface insulation resistance (SIR) patterns allow testing the cleanliness of the boards. The mounting of LEDs allows for visual testing without the use of an ohmmeter. The interconnect vias facilitate easy connection for environmental testing. The use of three images, which can be separated, allows the testing of test cards of different sizes. Fabricating the printed circuit using Organic Coat Copper (OCC) allows for testing of boards made with this technology. Fabricating the printed circuit using Hot Air Solder Leveling (HASL) allows for testing of boards made with this technology. Additionally, the use of multiple layers better simulates a product. The use of through hole connectors and face plate connectors which use different assembly processes also allows the tests cards to better simulate a real product.

DESCRIPTION OF THE PREFERRED EMBODIMENT

Figure 1:
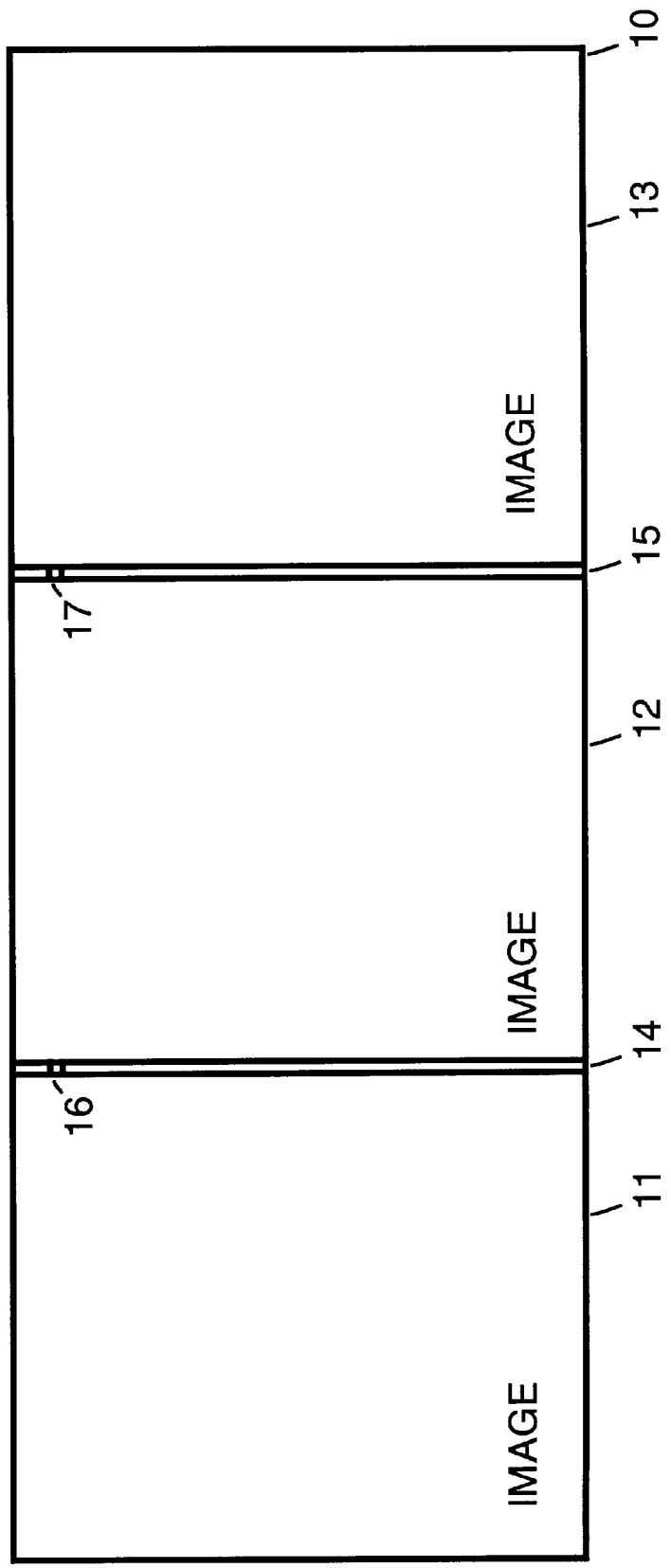
FIG. 1 is a simplified block diagram showing layout of a printed circuit board used for testing in accordance with the preferred embodiment of the present invention.

FIG. 1 is a simplified diagram showing layout of a ball grid array (BGA) test board 10. BGA test board 10 is a six-layer FR-4 glass epoxy printed circuit board. BGA test board 10 is fabricated using organic coat copper (OCC). There are three sections, or images, on test board 10. Shown in FIG. 1 is an image 11, an image 12 and an image 13. Each image is a duplicate of the others, except for numbering which appears on the board. In the preferred embodiment, all packages on image 11 are numbered in the tens. All packages on image 12 are numbered in the twenties. All packages on image 13 are numbered in the thirties.

A routing area 14 separates image 11 from image 12. Routing area 14 allows image 11 and image 12 to be separated into separate boards for individual testing. When image 11 is separated from image 12, the separation occurs at routing area 14.

Routing area 14 electrically isolates the collector voltage supply (VCC) plane for image 11 from the VCC plane for image 12. Routing area 14 isolates the ground plane for image 11 from the ground plane for image 12. A single trace 16 extends across routing area 14 to connect the ground plane for image 11 to the ground plane for image 12. The single trace 16 allows testing using a common ground when image 11 and image 12 remain attached.

Likewise, routing area 15 separates image 12 from image 13. Routing 15 area 15 allows image 12 and image 13 to be separated into separate boards for individual testing. When image 12 is separated from image 13, the separation occurs at routing area 15.

Routing area 15 electrically isolates the VCC plane for image 12 from the VCC plane for image 13. Routing area 15 isolates the ground plane for image 12 from the ground plane for image 13. A single trace 17 extends across routing area 15 to connect the ground plane for image 12 to the ground plane for image 13. The single trace 17 allows testing using a common ground when image 12 and image 13 remain attached.

Figure 2:
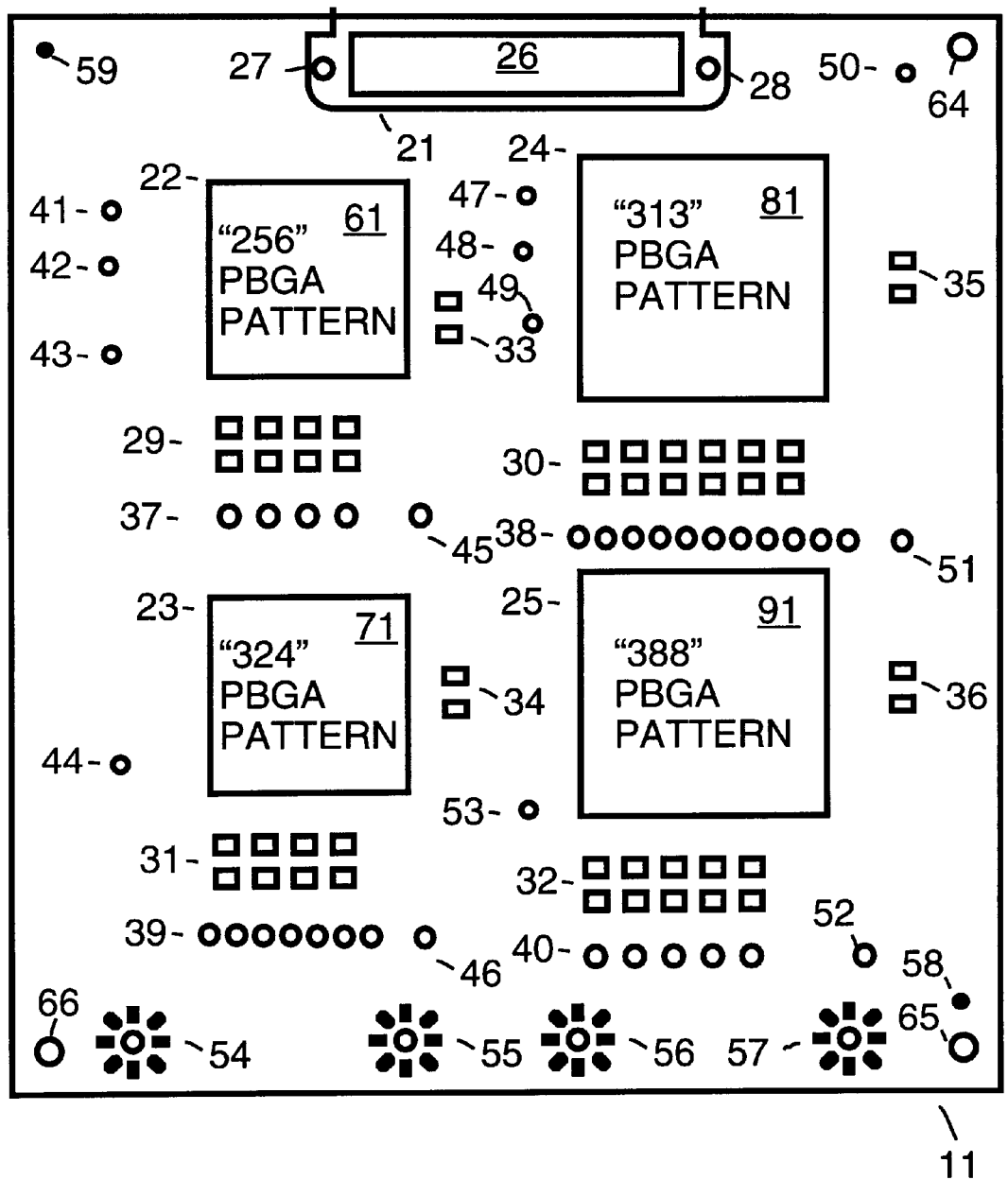
FIG. 2 is a simplified diagram which shows connections for an image of the printed circuit board shown in FIG. 1 in accordance with the preferred embodiment of the present invention.

FIG. 2 shows additional detail of image 11. Image 12 and image 13 have identical layouts. As illustrated by FIG. 2, four different packages can be attached to image 11. A 256 BGA input/output package can be attached to image 11 at a "256" BGA pattern 22 composed of interconnect pads 61. A 324 BGA input/output package can be attached to image 11 at a "324" BGA pattern 23 composed of interconnect pads 71. A 313 BGA input/output package can be attached to image 11 at a "313" BGA pattern 24 composed of interconnect pads 81. A 388 BGA input/output package can be attached to image 11 at a "388" BGA pattern 25 composed of interconnect pads 91.

A through hole connector area 21 is ready for attachment of a through hole connector. Eighty interconnect vias within a sub-area 26 are ready to receive the pins of a connector. A mounting hole 27 and a mounting hole 28 are available to secure the connector to BGA test board 10.

An interconnect via 41, an interconnect via 42. an interconnect via 43, an interconnect via 44, an interconnect via 47, an interconnect via 48, an interconnect via 49, an interconnect via 53 and an interconnect via 50 are each 0.050 inches in diameter and are suitable for soldering on test posts for ease of connection of test equipment.

Interconnect via 43 is an environmental test point for performing environmental checking the 256 BGA input/output package attached to image 11. Interconnect via 44 is an environmental test point for performing environmental checking the 324 BGA input/output package attached to image 11. Interconnect via 49 is an environmental test point for performing environmental checking the 313 BGA input/output package attached to image 11. Interconnect via 53 is an environmental test point for performing environmental checking the 388 BGA input/output package attached to image 11. Interconnect via 50 is a common environmental test point for performing environmental checking. The use of interconnect vias rather than surface pads allows for more permanent connection of probes for environmental testing.

Interconnect via 41 and interconnect via 42 are for checking the integrity of a surface insulation resistance (SIR) pattern (shown in FIG. 3) which is placed in the de-populated center area of "256" BGA pattern 22. Interconnect via 47 and interconnect via 48 are for checking the integrity of a surface insulation resistance (SIR) pattern (shown in FIG. 5), which is laid out at a 45 degree angle between the rows of interconnect pads within the area of "313" BGA pattern 24.

Each concentric row (or ring) of pads for a BGA input/output package, or pairs of concentric rows (rings) in the case of "313" BGA pattern 24, lead out to an LED and test pad for testing that ring independently of the other rings. Additionally, the whole set of pads is connected such that the whole package can be tested with the LED or an ohmmeter with one measurement.

Surface mount pads 29, surface mount pads 30, surface mount pads 31 and surface mount pads 32, are for mounting LED lights used in testing. Surface mount pads 33, surface mount pads 34, surface mount pads 35 and surface mount pads 36 are for mounting current limiting resistors.

Test pads 37 are for testing individual concentric rows of "256" BGA pattern 22. The test pad for the outer most concentric row is on the left and the test pad for the inner most concentric row is on the right. Common test pad 45 is used in conjunction with tests pads 37 to test the concentric rows of "256" BGA pattern 22. Test pads 39 are for testing individual concentric rows of "324" BGA pattern 23. The test pad for the outer most concentric row is on the left and the test pad for the inner most concentric row is on the right. Common test pad 46 is used in conjunction with test pads 39 to test the concentric rows of "324" BGA pattern 23.

Test pads 38 are for testing pairs of concentric rows of "313" BGA pattern 24. The test pad for the outer most pair of concentric rows is on the left and the test pad for the inner most pair of concentric rows is on the right. Common test pad 51 is used in conjunction with test pads 38 to test the concentric rows of "313" BGA pattern 24. Test pads 32 are for testing individual concentric rows of "388" BGA pattern 25. The test pad for the outer most concentric row is on the left and the test pad for the inner most concentric row is on the right. Common test pad 52 is used in conjunction with test pads 40 to test the concentric rows of "388" BGA pattern 25.

A wagon wheel 54, a wagon wheel 55, a wagon wheel 56 and a wagon wheel 57 are used for face plate connections.

As discussed above, there is a common ground running throughout BGA test board 10. The common ground is connected such that if the three images of BGA test board 10 are split apart, the common ground is still functional among the four packages mounted on each separate image. The common ground is electrically connected to common test pad 45, common test pad 46, common test pad 51 and common test pad 52.

Each image also has its own set of tooling holes and fiducial marks, so each individual image can be processed by itself. For example, FIG. 2 shows a fiducial mark 58, a fiducial mark 59, a tooling hole 64, a tooling hole 65 and a tooling hole 66. There are also vernier alignment marks in the x-axis in the lower left and upper right corners, used for checking alignment of the paste stencil.

After the four packages, resistors and LEDs are placed, reflowed, solder waved, and washed, a visual test of the board can be done using the LEDs. The inclusion of LEDs allows for testing with a test battery rather than using an ohmmeter. To test individual concentric rows of interconnections, one lead of a three volt DC battery is attached to the common test pad for the BGA input/output package to be tested. The other lead of the battery is connected to the test point for the concentric row to be tested. If there is continuity amongst all the interconnects for that row, the LED for the concentric row will light up, showing a "good" condition.

In order to run environmental tests, one lead of an ohmmeter or other continuity measuring device is attached to a common environmental test point such as via 50. The other lead of the ohmmeter is connected to an environmental test point for the BGA input/output package to be tested. For the 256 BGA input/output (I/O) package the environmental test point is interconnect via 43. For the 324 BGA input/output package the environmental test point is interconnect via 44. For the 313 BGA input/output package the environmental test point is interconnect via 49. For the 388 BGA input/output package the environmental test point is interconnect via 53. The reading on the ohmmeter should be in the range of a fraction of an ohm if the interconnections are all good. BGA test board 10 is then exposed to environmental test conditions.

In order to run the surface insulation resistance (SIR) test, the test equipment is connected to the two SIR test points for the test. To test the SIR comb pattern placed in the de-populated center area of "256" BGA pattern 22, interconnect via 41 and interconnect via 42 are used. To test the SIR comb pattern laid out at a 45 degree angle between the rows of interconnect pads within the area of "313" BGA pattern 24, interconnect via 47 and interconnect via 48 are used. BGA test board 10 is then exposed to the environmental conditions and the SIR test can be run as per industry standard procedures.

Figure 3:
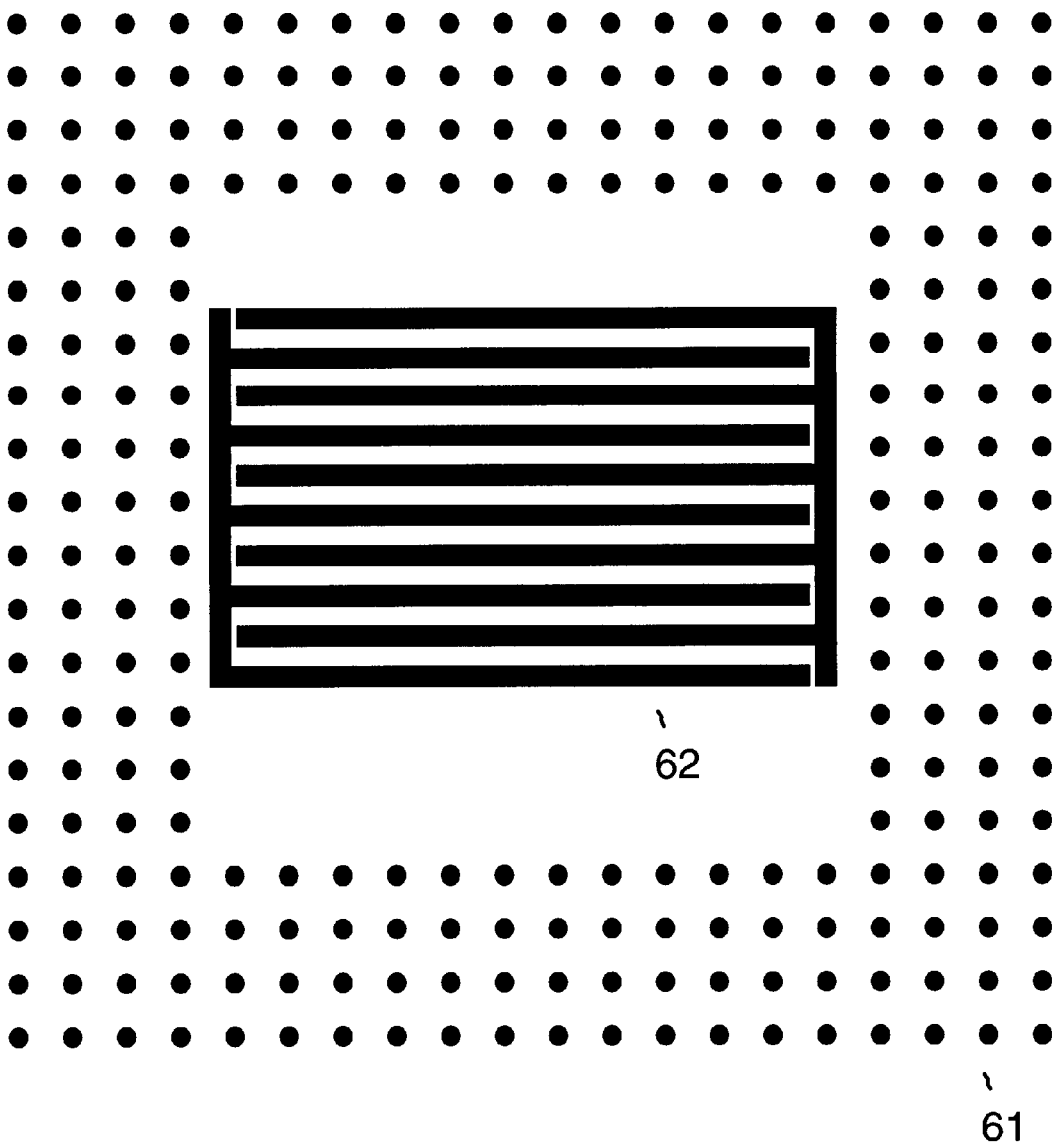
FIG. 3 is a simplified diagram which shows a 256 input/output ball grid array pattern and a surface insulation resistance pattern placed on the printed circuit board shown in FIG. 1 in accordance with the preferred embodiment of the present invention.

FIG. 3 shows interconnect pads 61 for "256" BGA pattern 22. Within the de-populated center area of interconnect pads 61 is a surface insulation resistance (SIR) pattern 62. SIR comb pattern 62 is used to test for cleanliness under the 256 BGA input/output (I/O) package.

Figure 4:
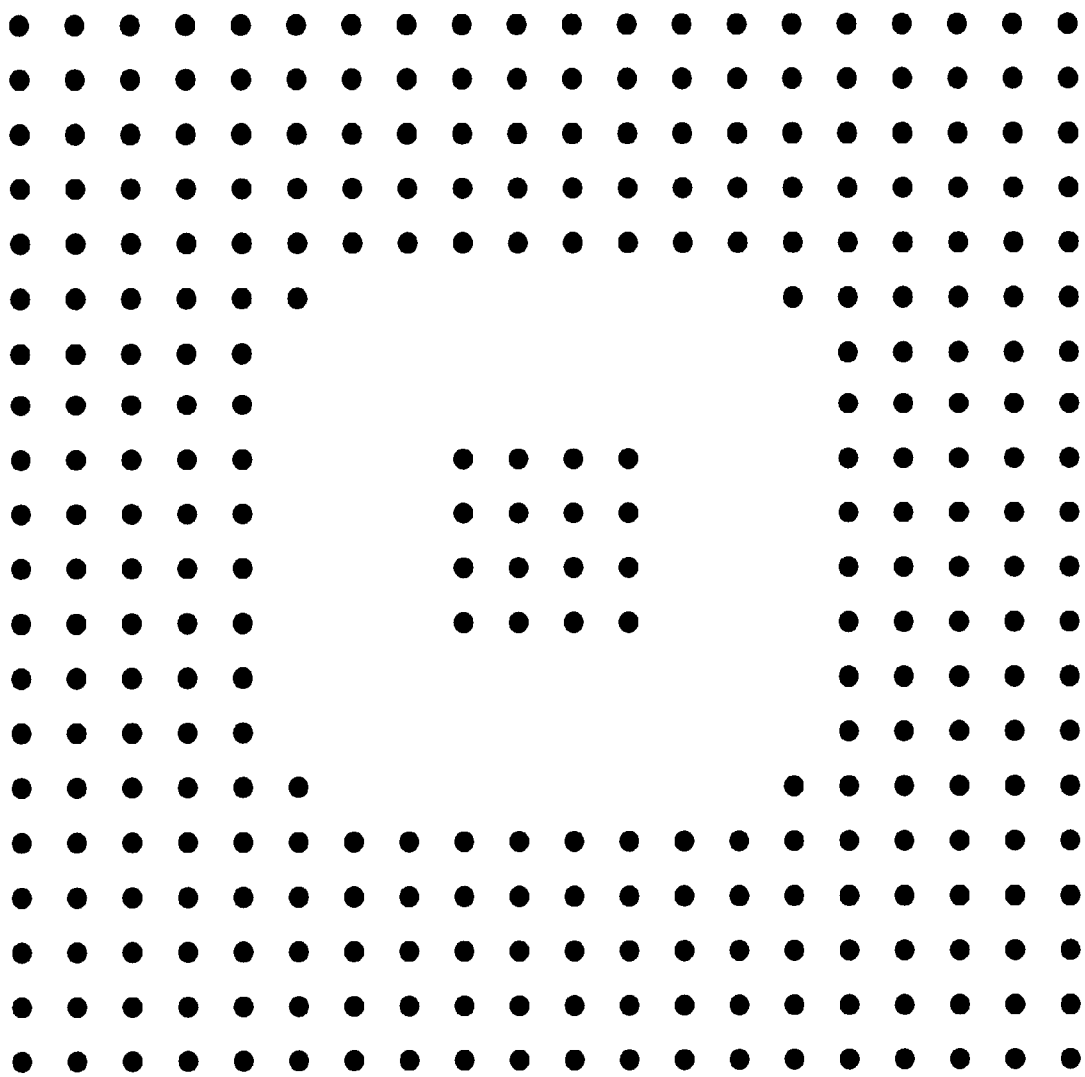
FIG. 4 is a simplified diagram which shows a 324 input/output ball grid array pattern placed on the printed circuit board shown in FIG. 1 in accordance with the preferred embodiment of the present invention.

FIG. 4 shows interconnect pads 71 for "324" BGA pattern 23.

Figure 5:
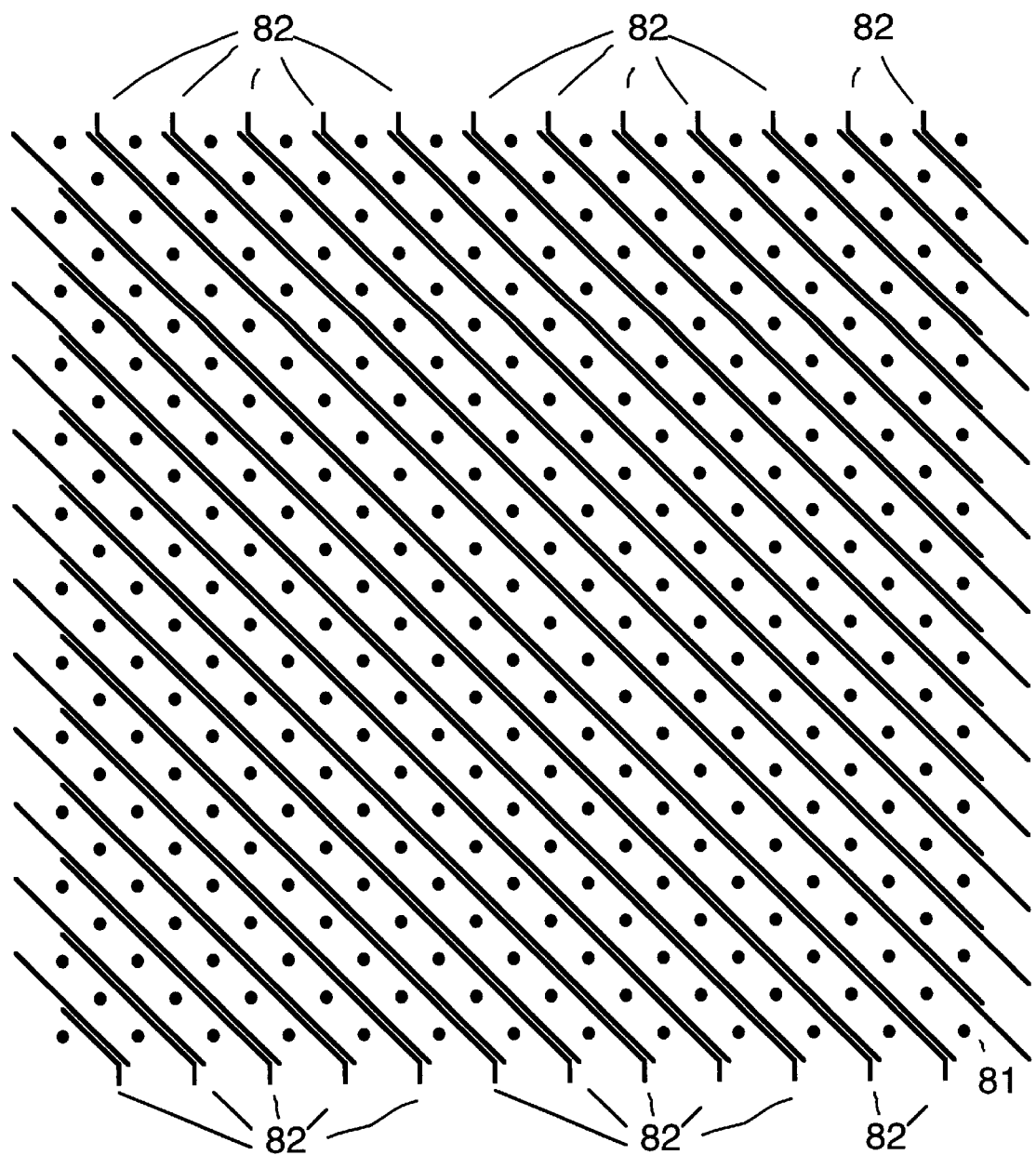
FIG. 5 is a simplified diagram which shows a 313 input/output ball grid array pattern and a surface insulation resistance pattern placed on the printed circuit board shown in FIG. 1 in accordance with the preferred embodiment of the present invention.

FIG. 5 shows interconnect pads 81 for "313" BGA pattern 24. A surface insulation resistance (SIR) pattern 82 is laid out at a 45 degree angle between the rows of interconnect pads 81 within the area of "313" BGA pattern 24. SIR comb pattern 82 is used to test for cleanliness under the 313 BGA input/output (I/O) package. The unique design of SIR comb pattern 82 precludes the need to remove some of the solder balls from the middle of the 313 BGA input/output package. Removal of some of the solder balls from the middle of a BGA input/output package alters the conditions of the test from conditions which would actually occur under manufacturing and use conditions.

Figure 6:
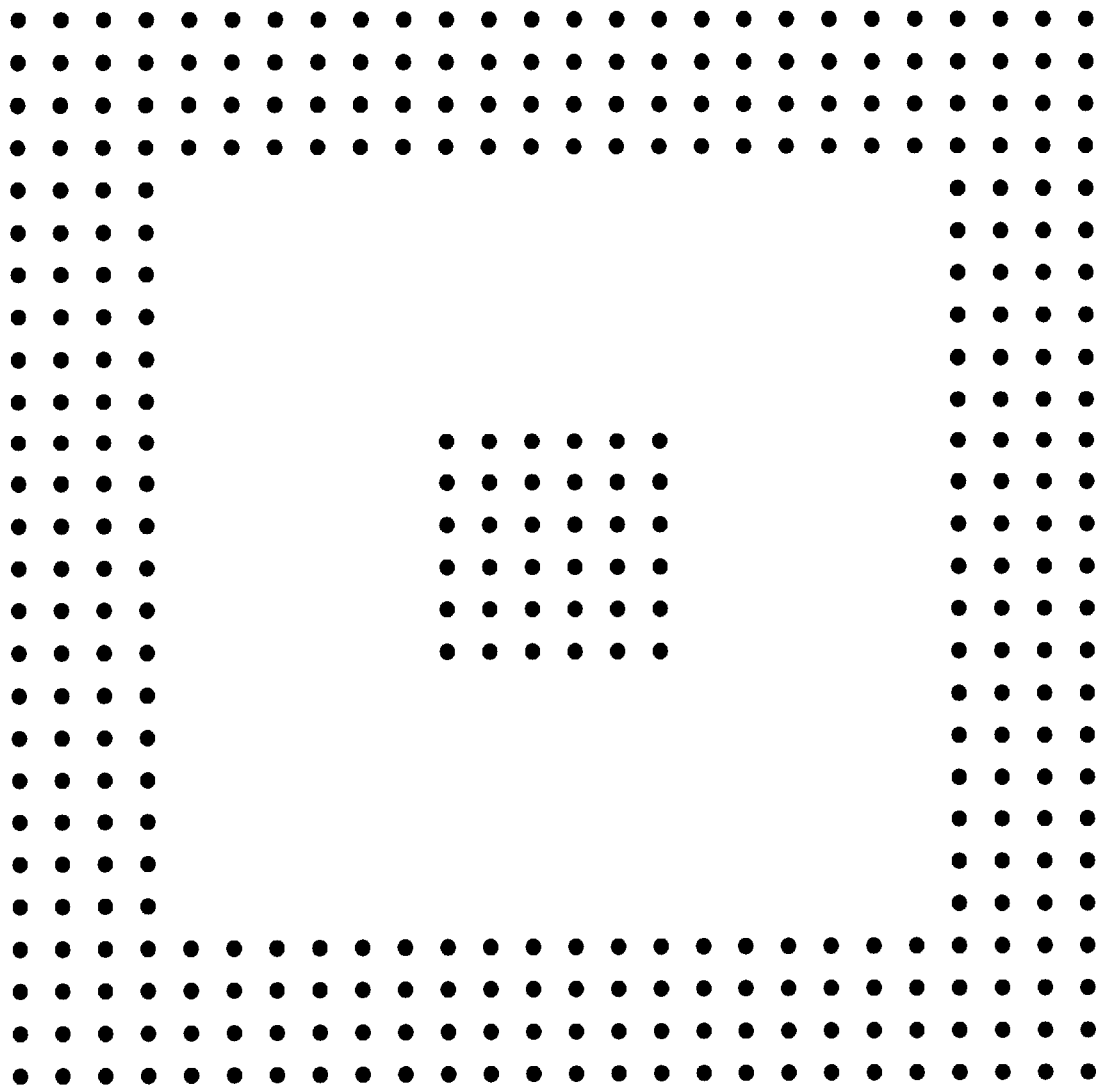
FIG. 6 is a simplified diagram which shows a 388 input/output ball grid array pattern placed on the printed circuit board shown in FIG. 1 in accordance with the preferred embodiment of the present invention.

FIG. 6 shows interconnect pads 91 for "388" BGA pattern 25.

Figure 7:
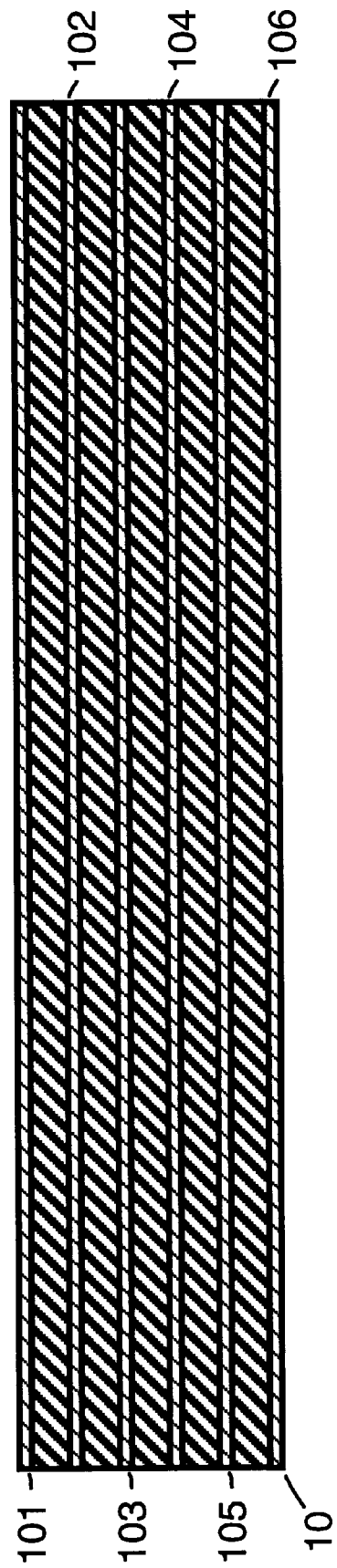
FIG. 7 is a simplified cross section of the printed circuit board shown in FIG. 1 in accordance with the preferred embodiment of the present invention.

FIG. 7 illustrates the six layers of BGA test board 10. A top layer 101 is laid out as shown in FIGS. 1 through 6. On a layer 102 is placed solid copper which is used to simulate a ground plane. Traces are placed on a layer 103 and a layer 104 to simulate signal transmission layers. Also in layer 104, identifying marks are etched in a particular pattern, so that each of the images can be distinguished under X-ray. On a layer 105 is placed solid copper which is used to simulate a VCC plane. Traces are placed on a layer 106. The traces are used as "stitching" which connects adjacent connectors of each BGA input/output package. Single trace 16 and single trace 17 can be placed on layer 106. Alternatively, single trace 16 and single trace 17 can be placed on another layer, e.g., layer 101.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A printed circuit board comprising:
   a first image, the first image comprising:
      a first array pattern for attaching a package,
      a first power plane, and
      a first ground plane;
   a second image, the second image comprising:
      a second array pattern for attaching a package,
      a second power plane, and
      a second ground plane;
   a first routing area between the first image and the second image, the first routing area electrically and physically isolating the first power plane from the second power plane, the first routing area also physically isolating the first ground plane from the second ground plane; and,
   a first single trace extending through the first routing area, the first single trace electrically connecting the first ground plane to the second ground plane.

2. A printed circuit board as in claim 1 additionally comprising:
   a third image, the third image comprising:
      a third array pattern for attaching a package,
      a third power plane, and
      a third ground plane;
   a second routing area between the second image and the third image, the second routing area electrically and physically isolating the second power plane from the third power plane, the second routing area also physically isolating the second ground plane from the third ground plane; and,
   a second single trace extending through the second routing area, the second single trace electrically connecting the second ground plane to the third ground plane.

3. A printed circuit board as in claim 2 wherein the third image is substantially identical to the first image, and the second image is substantially identical to the first image.

4. A printed circuit board as in claim 1 wherein the second image is substantially identical to the first image.

5. A printed circuit board as in claim 1:
wherein the first array pattern is a first ball grid array pattern for attaching a first input/output ball grid array package, the first ball grid array pattern including a de-populated center area; and,
wherein a first surface insulation resistance pattern is laid out within the de-populated center area of the first ball grid array pattern.

6. A printed circuit board as in claim 5 wherein the first image additionally comprises:
a second ball grid array pattern for attaching a second input/output ball grid array package, the second ball grid array pattern having rows of interconnect pads; and,
a second surface insulation resistance pattern laid out between the rows of interconnect pads.

7. A printed circuit board as in claim 6 wherein the first image additionally comprises:
a third ball grid array pattern for attaching a third input/output ball grid array package; and,
a fourth ball grid array pattern for attaching a fourth input/output ball grid array package.

8. A printed circuit board as in claim 1:
wherein the first array pattern is a first ball grid array pattern for attaching a first input/output ball grid array package, the first ball grid array pattern having rows of interconnect pads; and,
wherein a first surface insulation resistance pattern is laid out between the rows of interconnect pads.

9. A printed circuit board as in claim 1 wherein the first image additionally comprises:
a through hole connector area for receiving leads of a through hole connector.

10. A printed circuit board as in claim 1 wherein the first image additionally comprises:
a plurality of wagon wheel face plate connectors.

11. A printed circuit board as in claim 1 wherein the first image additionally comprises:
a plurality of pairs of surface mount pads, the plurality of pairs of surface mount pads being for mounting LEDs.

12. A printed circuit board as in claim 11 wherein the first image additionally comprises:
a plurality of interconnect vias for connecting terminals of a tester during environmental testing.

13. A printed circuit board as in claim 1 wherein the first image additionally comprises:
a plurality of interconnect vias for connecting terminals of a tester during environmental testing.

14. A printed circuit board as in claim 1:
wherein the first image includes first fiducial marks and first tooling holes; and,
wherein the second image includes second fiducial marks and second tooling holes.

15. A printed circuit board comprising:
a first image, the first image comprising:
a first ball grid array pattern for attaching a first input/output ball grid array package, the first ball grid array pattern having rows of interconnect pads, and
a first surface insulation resistance pattern laid out between the rows of interconnect pads.

16. A printed circuit board as in claim 15 wherein the first image additionally comprises:
an additional ball grid array pattern for attaching an additional input/output ball grid array package.

17. A printed circuit board as in claim 15 wherein the first image additionally comprises:
a plurality of pairs of surface mount pads, the plurality of pairs of surface mount pads being for mounting LEDs.

18. A printed circuit board as in claim 17 wherein the first image additionally comprises:
a plurality of interconnect vias for connecting terminals of a tester during environmental testing.

19. A printed circuit board as in claim 15 wherein the first image additionally comprises:
a plurality of interconnect vias for connecting terminals of a tester during environmental testing.

20. A printed circuit board as in claim 15 wherein the printed circuit board is fabricated using organic coat copper.

21. A printed circuit board as in claim 15 wherein the first image includes fiducial marks and tooling holes.

* * * * *